THERMOELECTRIC COOLING DEVICES

Filed July 23, 1959 3 Sheets-Sheet 1

INVENTORS
HARRY BURY
ROY CLAYDON
REGGIE SMITH
BY Kuschbaum, Kuschbaum & Ottinger
ATTORNEYS INVENTORS
HARRY BURY
ROY CLAYDON
REGGIE SMITH
BY Kurschlein, Kurschlein + Ottinger
ATTORNEYS INVENTORS
HARRY BURY
ROY CLAYDON
REGGIE SMITH
BY Kurschner, Kurschner & Ottinger
ATTORNEYS United States Patent Office 3,018,631

Patented Jan. 30, 1962

3,018,631

THERMOELECTRIC COOLING DEVICES

Harry Bury, Ickenham, Roy Claydon, London, and Reggie Smith, Kenton, England, assignors to The General Electric Company Limited, London, England Filed July 23, 1959, Ser. No. 829,036
Claims priority, application Great Britain July 28, 1958
10 Claims. (Cl. 62—3)

Figures 1, 2:
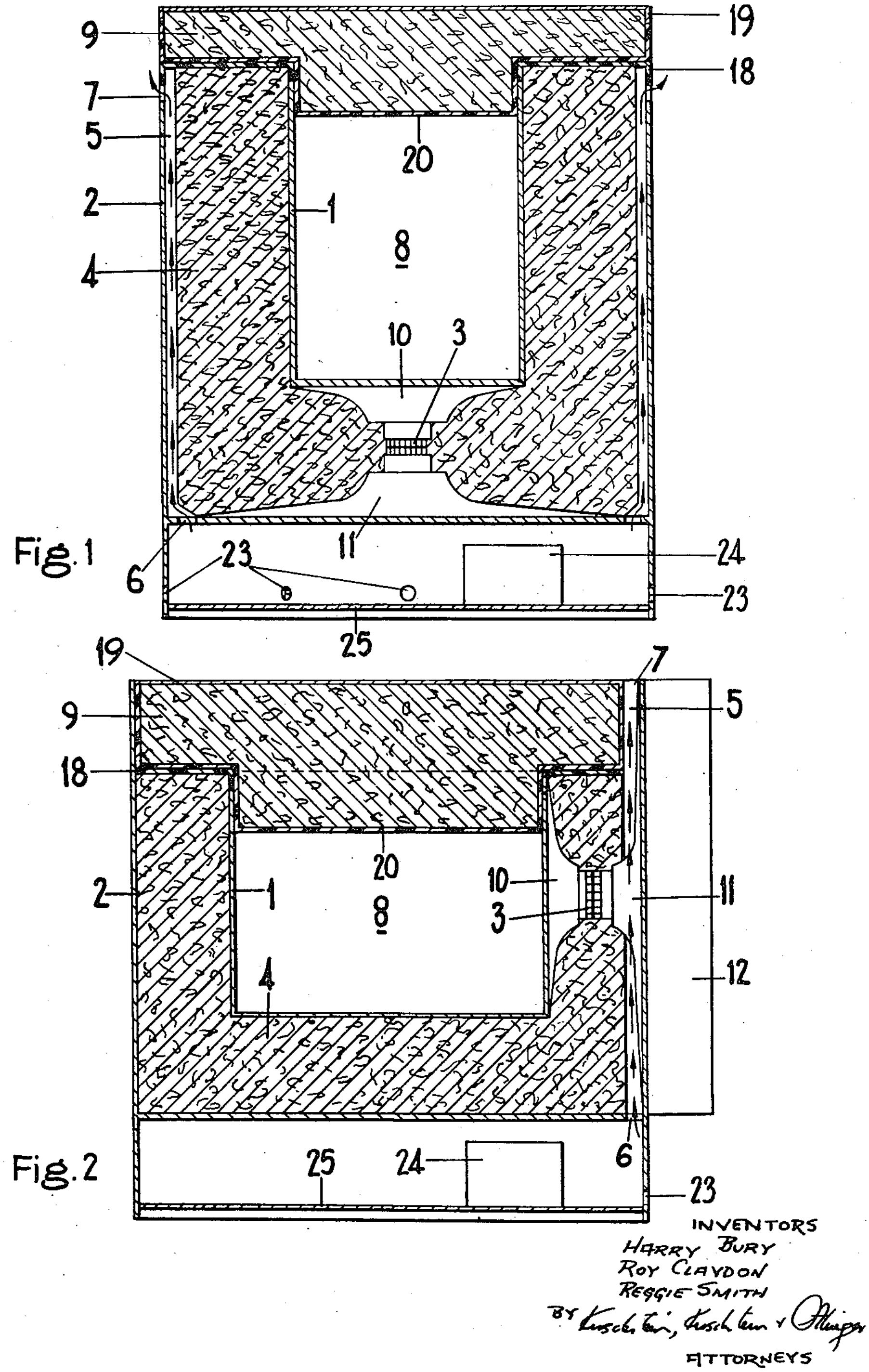

This invention relates to thermoelectric cooling devices having a storage chamber which is arranged to be cooled by thermoelectric means.

In such devices the thermoelectric means usually comprises a number of dissimilar thermoelectric elements which are electrically connected to provide cold junctions and hot junctions, these junctions being disposed in heat exchange relation with the chamber and with an external cooling medium respectively. The elements may be disposed within the wall of the cooling chamber, and may be distributed over substantially the whole area of the wall; alternatively the elements may be grouped in a compact assembly extending over a relatively small area of the wall, heat exchange means being provided to ensure the efficient transfer of heat to and from the junctions. The latter type of construction is particularly suitable where the thermoelectric elements are of certain semiconducting materials, such as bismuth telluride, the heat exchange means usually being fin assemblies providing a large surface area for dissipating or abstracting heat. In small refrigerators and other cooling devices it is usually inconvenient to place bulky heat exchange members such as cooling fins inside the cooling chamber where storage space needs to be conserved, and very frequently it is inconvenient, or at least undesirable, for the overall volume of the device to be increased by external heat exchange members.

One object of the present invention is to provide a thermoelectric cooling device having a compact construction whereby the storage space is conserved to a maximum extent and in addition, or alternatively, in which the overall volume of the device is not undesirably increased by the presence of external heat exchange members.

According to one aspect of the present invention a thermoelectric cooling device comprises a cooling chamber, said chamber having a thermally insulating wall, a thermocouple assembly arranged to provide hot junctions and cold junctions, said assembly being mounted in said wall, and first and second heat exchange means disposed respectively in heat conducting relation with said hot junctions and said cold junctions, said heat exchange means being disposed on opposite sides of said wall and at least one of said heat exchange means being constituted by a metal casing member forming part of said wall and constituting a thermally conducting surface thereof.

According to another aspect of the present invention a thermoelectric cooling device comprises a thermally insulated cooling chamber, a thermocouple assembly arranged to provide hot junctions and cold junctions disposed respectively on opposite sides of the assembly, the assembly being mounted in the wall of said chamber, first heat exchange means disposed in heat conducting relation with one set of junctions, and second heat exchange means disposed in heat conducting relation with the other set of junctions, said second heat exchange means being thermally insulated from said first heat exchange means and being constituted by a metal casing member forming part of the wall of said chamber.

Thus the second heat exchange means may be disposed in heat conducting relation with the cold junctions of the thermocouple assembly and adapted to form a lining to said chamber. Alternatively, the second heat exchange means may be disposed in heat conducting relation with the hot junctions of the thermocouple assembly and adapted to form a jacket for the device.

According to yet another aspect of the present invention in a thermoelectric cooling device comprising a thermally insulated cooling chamber, a thermocouple assembly disposed within the wall of said chamber and providing hot junctions and cold junctions disposed respectively on opposite sides of the assembly whereby to cool said chamber, and first and second heat exchange members disposed respectively in heat conducting relation with the cold junctions and the hot junctions of the assembly, the heat exchange members are constituted by a pair of metal casing members or shells disposed one within the other and forming respectively a lining or part lining to said chamber and a jacket for the device, which jacket is adapted to be cooled by cooling medium.

In order to inscrease the surface area from which heat may be dissipated from the outer casing member or shell, a vent for cooling medium, may be provided adjacent to its inner surface so that the casing member or shell may be cooled on both its inner and outer surfaces. The provision of this vent serves additionally to reduce the temperature difference between the casing members or shells thereby reducing thermal leakage.

The outer casing member may be cooled by natural air circulation, or it may be water-cooled.

Figures 3, 5:
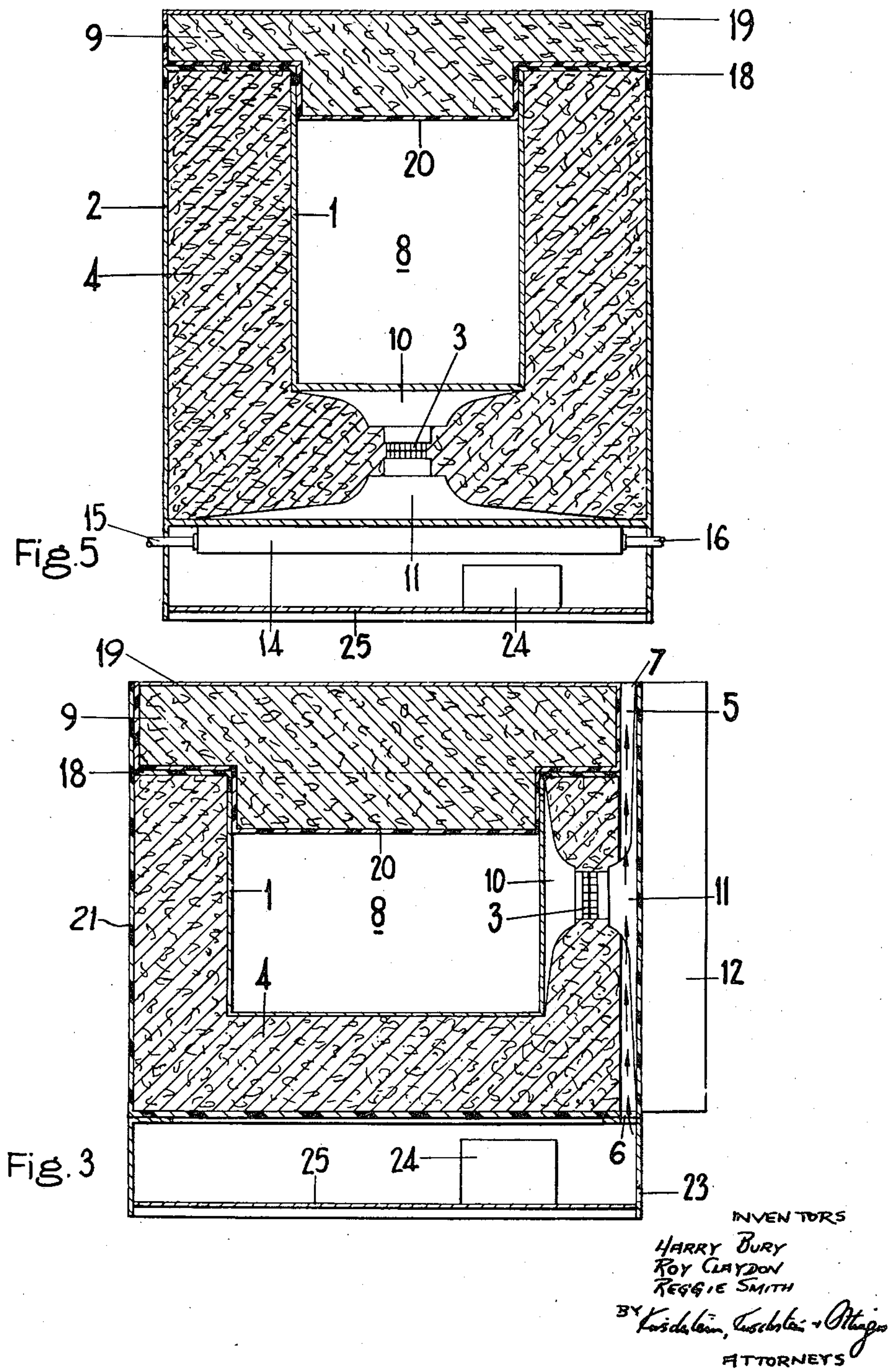
Figures 6, 7:
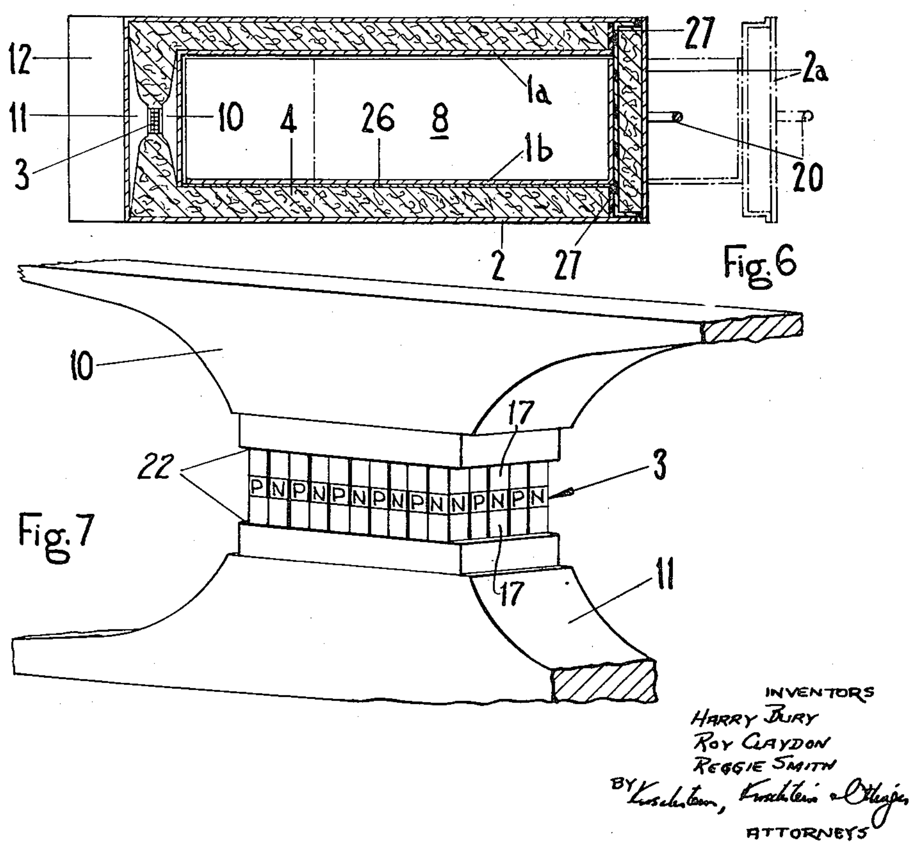

In order that the invention may be more readily understood, six thermoelectric cooling devices in accordance with the invention will now be described, by way of example, with reference to the accompanying drawings, in which FIGURES 1 to 5 are sectional elevation views of the first five devices, FIGURE 6 is a sectional elevational view of the sixth device, and FIGURE 7 is a fragmentary perspective view of a typical thermocouple assembly used in these devices.

Referring to FIGURE 1, the first thermoelectric cooling device comprises essentially a thermally insulated cooling chamber 8 and thermoelectric means 3 for cooling the chamber. The thermoelectric means 3, which will be described in more detail hereinafter, comprises a thermocouple assembly electrically connected to provide hot junctions and cold junctions disposed respectively on its opposite sides. The wall of the cooling chamber 8 is formed by a pair of cylindrical aluminium casings 1 and 2 disposed one within the other, these casings being open at their upper ends, and the thermoelectric means 3 being disposed between the closed lower ends of the casings. The casings 1 and 2 are respectively in good heat conducting relation with the cold junctions and the hot junctions of the thermoelectric means 3, there being provided between the ends of the casings and the respective surfaces provided by these junctions, for the efficient conduction of heat therebetween, flared transition members 10 and 11 of good heat conducting material such as aluminium. The space between the casings 1 and 2 is almost entirely filled with heat insulating material 4 in order to insulate the chamber 8 from its surroundings. Between the material 4, and the inner surface of the outer casing 2, however, is an annular vent 5 through which cooling air may pass from apertures 6 at the bottom of the vent to outlet apertures 7 near the top. The cylindrical side portion of the casing 2 is extended to provide a skirt having apertures 23 to permit the air flow, and a power pack 24, for supplying direct current to the thermocouples, is mounted on a frame 25 within the skirt.

The inner casing 1, besides forming part of the wall of the chamber 8 and constituting a heat exchange member between the chamber and the cold junctions, also forms a thermally conducting lining for the chamber whereby it is ensured that the temperature within the chamber remains substantially uniform throughout. The outer casing 2 also forms a protective jacket for the device. The casings may with advantage be formed so that their flat portions are of thick gauge aluminium and their cylindrical portions are of thinner gauge aluminium.

The upper end of the chamber wall is formed by a plastic trim strip 19 moulded to the upper ends of the casings 1 and 2, thus completely encasing the heat insulating material 4. A lid 9 is provided so that access may be had to the chamber 8, this lid being mainly of heat insulating material encased between a sheet metal upper portion 19 and a moulding of plastic material 20 forming the lower surface of the lid. A rubber gasket (not shown) may be provided between the lid and the cooperating surface at the upper end of the chamber wall.

Referring now to FIGURE 2, the second cooling device is very similar to the first, comprising inner and outer metal casings 1 and 2, insulating material 4 between the casings, and thermoelectric cooling means 3. The casing 1 is a rectangular box formed of aluminium, one side of which is bonded to a heavy sectioned transition member 10, also of aluminium, which is in good heat conducting relation with the cold junctions of the means 3. The outer casing 2 has one side of aluminium, this side being bonded to a heavy sectioned transition member 11 in good heat conducting relation with the hot junctions, and its remaining sides and base are of mild steel since they are not required to conduct large amounts of heat. The casing 2 is mounted on a skirt having apertures 23, and a power pack 24 is mounted on a frame 25 supported by the skirt. The vent 5 for cooling air is situated adjacent to the inner surface of one side only of the outer casing, and on the outer surface of this side cooling fins 12 are provided. As in the first device, the casings are open at the top, and a plastic trim strip 18 is moulded to the upper end of the cooling chamber wall. In order to provide access to the chamber 8 a removable lid 9 is provided.

It will be seen that in each of the above constructions, the casings themselves act as heat exchange members each providing a heat transfer surface of a substantially larger area than the hot and cold surfaces provided by the thermojunctions. In addition the casings respectively provide a thermally conducting lining for the storage chamber 8 and a protective jacket for the device, and being disposed in the manner shown each is adapted to form part of the wall of the cooling chamber.

Referring now to FIGURE 3, the third cooling device is essentially similar in construction to the second, the same numerals being employed to denote like parts but the heat exchange member associated with the hot junctions of the thermocouple assembly is constituted by a fin assembly 12, instead of a metal casing. A casing 21 of plastic material is moulded to form the outer surface of the cooling chamber wall. As in the preceding example, the heat exchange member associated with the cold junctions of the thermocouple assembly is constituted by a metal casing 1 lining the cooling chamber 8.

Figure 4:
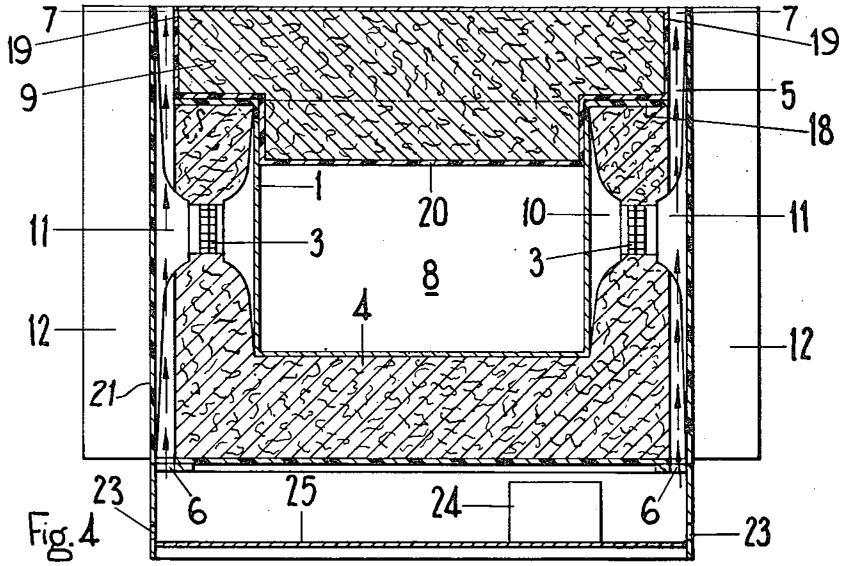

Referring now to FIGURE 4, the fourth cooling device differs from the third only in that the thermoelectric cooling means comprises two compact thermocouple assemblies mounted on opposite sides of the cooling chamber, there being two fin assemblies 12 for cooling the hot junctions of the assemblies. In some cases it may be advantageous for the device to include a fan for force cooling the fins and/or assisting the air flow through the vents 5.

FIGURE 5 illustrates a modification of the device shown in FIGURE 1. In this modification the outer casing 2 is adapted to be water-cooled, there being provided a water jacket 14 in good thermal contact with the base of the casing 2 and having an inlet 15 and an outlet 16.

Referring now to FIGURE 6, the sixth device is constructed as a cabinet having a sliding drawer so that access may be had to the cooling chamber 8. One side **2*a* of the outer casing 2 forms the front part of drawer and may be of mild steel instead of aluminium, the remaining sides of this casing being of aluminium, having fins 12 on its back. The inner casing 1 is in two separable parts, namely a fixed part 1*a* of aluminium forming a lining for the back and the roof of the cooling chamber 8, and a sliding part 1*b* of mild steel forming a lining for the floor, sides and front of the chamber. The part 1*b* slides on a fixed mild steel surface 26. A breaker, or plastic trim strip 27 is provided. The front of the drawer has a handle 20**.

Referring now to FIGURE 7, a thermoelectric cooling means 3 suitable for use in any of the above constructions comprises a plurality of p-type and n-type semiconductor elements, these being of bismuth telluride. The elements are disposed in a chequer-board pattern, adjacent elements being of opposite conductivity type. Each element is disposed between two aluminium stalks 17 which are soldered to opposite faces of the element, and the stalks and elements are packed together in the manner shown to form a substantially solid block. In order to provide the electrical connections between the semiconductor elements appropriate pairs of stalks are soldered together, adjacent stalks being alternately connected together and insulated from one another so as to connect the elements of the assembly electrically in series. Flared members 10 and 11 of good heat conducting material are bonded onto opposite sides of the block, these members being electrically insulated from the block by bonded resin 22. The members 10 and 11 provide for the efficient transfer of heat between the hot and cold surfaces of the block and the larger surface areas of the heat exchange members associated therewith.

In each of the embodiments described, the thermocouple assembly is designed to carry a current of about 10 amperes. The temperatures of the various components during normal operation may be seen from the following table, which relates to the device shown in FIGURE 2; these temperatures are typical for the devices described.

| | ° C. |
|---|---|
| Ambient | 30 |
| Outer heat exchange means | 35 |
| Hot junctions | 38 |
| Cold junctions | —3 |
| Inner heat exchange means | —1 |
| Air temperature in cooling chamber | 5 |

We claim:

1. A thermoelectric cooling device comprising a cooling chamber, said chamber having a thermally insulating wall, a thermocouple assembly mounted in said wall, said assembly comprising alternately disposed p-type and n-type semiconductor elements assembled in a compact array and connected to provide hot junctions and cold junctions on its opposite sides, first and second heat exchange means disposed on opposite sides of said wall, and first and second conducting transition members connecting said first and second heat exchange means in conductive relation to said hot junctions and cold junctions respectively, each said transition member providing a thermally conductive path of increasing cross section from the junctions to the respective heat exchange means, and at least one of said heat exchange means being constituted by a metal casing member forming a part of said wall and constituting a thermally conducting surface thereof.

2. A thermoelectric cooling device comprising a cooling chamber, said chamber having a thermally insulating wall, a thermocouple assembly mounted in said wall, said assembly comprising alternately disposed p-type and n-type semiconductor elements assembled in a compact array and connected to provide hot junctions and cold junctions on its opposite sides, first and second heat exchange means disposed on opposite sides of said wall, and first and second conducting transition members connecting said first and second heat exchange means in conductive relation to said hot junctions and cold junctions respectively, each said transition member providing a thermally conductive path of increasing cross section from the junctions to the respective heat exchange means and said second heat exchange means being constituted by a metal casing member forming a part of said wall and constituting a thermally conducting lining to said chamber.

3. A thermoelectric cooling device as set forth in claim 2, wherein the said casing member is of aluminum.

4. A thermoelectric cooling device comprising a cooling chamber, said chamber having a thermally insulating wall, a thermocouple assembly mounted in said wall, said assembly comprising alternately disposed p-type and n-type semiconductor elements assembled in a compact array and connected to provide hot junctions and cold junctions on its opposite sides, first and second heat exchange means disposed on opposite sides of said wall, and first and second conducting transition members connecting said first and second heat exchange means in conductive relation to said hot junctions and cold junctions respectively, each said transition member providing a thermally conductive path of increasing cross section from the junctions to the respective heat exchange means and said first heat exchange means being constituted by a metal casing member forming a part of said wall and constituting a heat-dissipating jacket for the device.

5. A thermoelectric cooling device as set forth in claim 4, wherein said casing member is of aluminum.

6. A thermoelectric cooling device comprising a cooling chamber, said chamber having a thermally insulating wall, a thermocouple assembly mounted in said wall, said assembly comprising alternately disposed p-type and n-type semiconductor elements assembled in a compact array and connected to provide hot junctions and cold junctions on its opposite sides, first and second heat exchange means disposed on opposite sides of said wall, and first and second conducting transition members connecting said first and second heat exchange means in conductive relation to said hot junctions and cold junctions respectively, each said transition member providing a thermally conductive path of increasing cross section from the junctions to the respective heat exchange means, and said first and second heat exchange means being constituted by metal casing members forming respectively a heat-dissipating jacket for the device and a conducting lining to said chamber.

7. A thermoelectric cooling device comprising a cylindrical cooling chamber, said chamber having a thermally insulating wall, first and second cylindrical metal casing members disposed on opposite sides of said wall, each said member having a closed end, said first member constituting a heat conducting outer surface of said wall, and said second member constituting a heat conducting inner surface of said wall, a thermocouple assembly mounted in said wall between the closed ends of said casing members, said thermocouple assembly comprising alternately disposed p-type and n-type semiconductor elements assembled in a compact array and connected to provide hot junctions and cold junctions on its opposite sides, a first conducting transition member disposed between said hot junctions and said first casing member, and a second conducting transition member disposed between said cold junctions and said second casing member, each said transition member providing a heat conducting path of increasing cross section from the junctions to the respective casing member.

8. A thermoelectric cooling device as set forth in claim 7, wherein the chamber has a detachable cover for providing access to the chamber.

9. A thermoelectric cooling device comprising a cooling chamber, said chamber having a thermally insulating wall, a plurality of thermocouple assemblies mounted in said wall, each said thermocouple assembly comprising alternately disposed p-type and n-type semiconductor elements assembled in a compact array and connected to provide hot junctions and cold junctions on its opposite sides, means for dissipating heat from said hot junctions, a metal casing member disposed within said chamber in heat conducting relation with said cold junctions, said casing member forming a part of said wall and constituting a heat conducting lining to said chamber, and a heat conducting transition member disposed between said casing member and the cold junctions of each said thermocouple assembly, said transition member providing a heat conducting path of increasing cross-section from the junctions to the casing member.

10. A thermoelectric cooling device comprising a cooling chamber, said chamber having a thermally insulating wall, a thermocouple assembly mounted in said wall, said thermocouple assembly comprising alternately disposed p-type and n-type semiconductor elements assembled in a compact array and connected to provide hot junctions and cold junctions on its opposite sides, means for dissipating heat from said hot junctions, a metal casing member disposed within said chamber in heat conductive relation with said cold junctions, said casing member forming a part of said wall and constituting a heat conducting lining to said chamber, a sliding drawer in said chamber for providing access thereto, said drawer constituting a thermally insulating closure member disposed between said casing member and the cold junctions of said thermocouple assembly, said transition member providing a heat conducting path of increasing cross-section from the junctions to the casing member.

References Cited in the file of this patent

UNITED STATES PATENTS

| | | |
|---|---|---|
| 413,136 | Dewey | Oct. 15, 1889 |
| 1,818,437 | Stuart | Aug. 11, 1931 |
| 2,356,778 | Morrison | Aug. 29, 1944 |
| 2,483,439 | Schweller | Oct. 4, 1949 |
| 2,592,233 | Atchison | Apr. 8, 1952 |
| 2,667,763 | Harris | Feb. 2, 1954 |
| 2,872,788 | Londenblad | Feb. 10, 1959 |
| 2,886,618 | Goldsmid | May 12, 1959 |
| 2,922,284 | Danielson | Jan. 26, 1960 |
| 2,932,953 | Becket | Apr. 19, 1960 |

FOREIGN PATENTS

| | | |
|---|---|---|
| 817,076 | Great Britain | July 22, 1959 |
| 817,077 | Great Britain | July 22, 1959 |